United States Patent [19]
Stubblefield et al.

[11] Patent Number: 6,043,101
[45] Date of Patent: Mar. 28, 2000

[54] IN-SITU MULTIPROBE RETEST METHOD WITH RECOVERY RECOGNITION

[75] Inventors: Todd Stubblefield; Craig Reagan, both of Sherman, Tex.

[73] Assignee: Texas Instruments Incorporated, Dallas, Tex.

[21] Appl. No.: 09/007,982

[22] Filed: Jan. 15, 1998

Related U.S. Application Data

[60] Provisional application No. 60/033,761, Jan. 15, 1997.
[51] Int. Cl.[7] .......................... H01L 21/66; G01R 31/26; B07C 5/344
[52] U.S. Cl. .............................. 438/10; 438/17; 324/754; 209/573
[58] Field of Search .............................. 324/754; 438/10, 438/14, 5, 17; 209/573

[56] References Cited

U.S. PATENT DOCUMENTS

| | | | |
|---|---|---|---|
| 5,927,512 | 7/1999 | Beffa | 209/573 |
| 5,943,552 | 8/1999 | Koveshnikov et al. | 438/17 |

*Primary Examiner*—Brian Dutton
*Attorney, Agent, or Firm*—W. James Brady III; Richard L. Donaldson

[57] ABSTRACT

This invention is a test methodology that immediately retests failed chips to recover false tester reads with no loss of test floor capacity during multiprobe production testing of integrated circuit chips on a wafer. This method retests a chip a second time prior to the multiprobe going to the next chip on the wafer, thus eliminating lost time in repositioning the multiprobe.

20 Claims, 2 Drawing Sheets

IN-SITU MULTIPROBE RETEST METHOD WITH RECOVERY RECOGNITION

This application claims priority under 35 USC §119(e)(1) of provisional application Ser. No. 60/033,761 filed Jan. 15, 1997.

BACKGROUND OF THE INVENTION

1. Field of the Invention

This invention generally relates to testing of integrated circuit devices and more particularly to multiprobe testing of integrated circuit devices.

2. Relevant Background

Massive quantities of completely fabricated integrated circuits are functionally tested, i.e. probed in wafer form by a multiprobe test device before separation and encapsulation of the integrated circuits into individual packages. With considerations of cycle time in a capacity limited multiprobe area, a substantial number of the integrated circuits or chips are flagged as failures during this testing when, in fact, they are actually nominally acceptable chips.

This misdiagnosis is primarily caused by sporadic tester relay hang-ups or problematic test program sequencing and timing problems which are generally inherent in the multiprobe test equipment. The multiprobe test equipment includes a large number of relays which must mechanically open or close electrical contacts during the test sequences. Operation of these relays is usually consistent and reliable. However, with any complex electromechanical system, there may develop, and indeed there are, intermittent contact hang-ups and partial connections which not only are hard to isolate, but may occur randomly and infrequently in any one relay.

These bogus chip failures are taken on as acceptable yield loss during mass production to avoid loss of test floor output from re-setup of a test machine to reprobe the affected wafers. In other words, these failures are accepted based on the costs in lost time of remounting the wafers and retesting these chips.

However, this yield loss is cumulatively costly. The only option has been to hold the affected lot of wafers if yields were low enough to be held for yield analysis until failed chips could be found unverifiable. Then the selected wafers were sent back for resetup and reprobing. This course of action is time intensive and greatly increases multiprobe cycle time. Only wafers with greater than 7% failures are conventionally typically reprobed, due to capacity limitations.

Therefore there is a need for a method of automatically retesting failed chips without having to reset the wafer and reposition the multiprobe.

SUMMARY OF THE INVENTION

It is therefore an object of the present invention to provide a method of multiprobe wafer testing which identifies bogus test failures without having to remount and reprobe failed wafers.

It is another object of the present invention to provide a method of multiprobe wafer testing which enhances the product yield rate from the test operation.

This invention outlines a test methodology that immediately retests failed chips to recover false tester reads with no loss of test floor capacity. This method retests a chip a second time prior to the multiprobe going to the next chip on the wafer, thus eliminating lost time in repositioning the multiprobe. Since the failures of concern, i.e., misconnection of relay contacts in the test apparatus rather than actual failures in the chip being tested, are usually random and not repeatable, the retest, if good, indicates that the chip is actually good.

The method according to the present invention basically comprises the steps of:

1) positioning a multiprobe in contact with leads of a first integrated circuit chip on a wafer;
2) performing a predetermined series of tests once on the first integrated circuit chip;
3) determining whether said first integrated circuit failed one of the tests in the series of tests; and
4) performing the predetermined series of tests a second time on the first chip;
5) flagging the chip as a reject only if the chip fails one of the tests performed for the second time; and
6) repositioning the multiprobe to another chip on the wafer and repeating steps 2 through 5.

The advantage of this method is that it identifies those chips that would otherwise be counted as failures and lead to higher than necessary wafer rejects. In addition, the method reduces the production losses with a minimal expenditure of time in conducting the retest. The end result is increased production yield with little loss in production test time.

These and other objects, features and advantages of the invention will be apparent to those skilled in the art from the following detailed description of the invention, when read in conjunction with the accompanying drawings and appended claims.

BRIEF DESCRIPTION OF THE DRAWINGS

In the various figures of the drawing, like reference numerals are used to denote like or similar parts.

DETAILED DESCRIPTION OF THE INVENTION

As previously described, the conventional wafer test method is to position a multi-pin probe in contact with the pins on a first device or chip. The procedure automatically starts testing the chip one pin at a time, starting with an initial continuity test. Several power supplies are activated, a number of relays are triggered, in order for the pin under test to be tested. If the pin passes the test the test program directs the procedure to pin number 2 and so on until it finishes testing all 20 pins. If all 20 pins pass the continuity test, the program directs the tester to the next test. This process repeats for a number of subsequent tests which can number into the hundreds with as many as 20 pins each depending on the test sequence. Each of these tests involve different power supply relay contact connections, wait times, and circuit configurations. These actions, with every power supply, relay contact change, and wait time consumes only microseconds. If just one pin fails any one of these tests the conventional program instructs a mapping system to mark the particular chip as a bad chip and to index the multi-pin probe to the next chip for a repeat of the same testing procedure.

The method in accordance with the present invention automatically introduces an in-situ retest after first fail of any individual test and is implemented to recapture any yield loss caused by a tester or program problem which could generate from any of the thousands of power supply ramp ups, wait time, relay switches, etc. that occurs while testing any chip.

Figure 1:
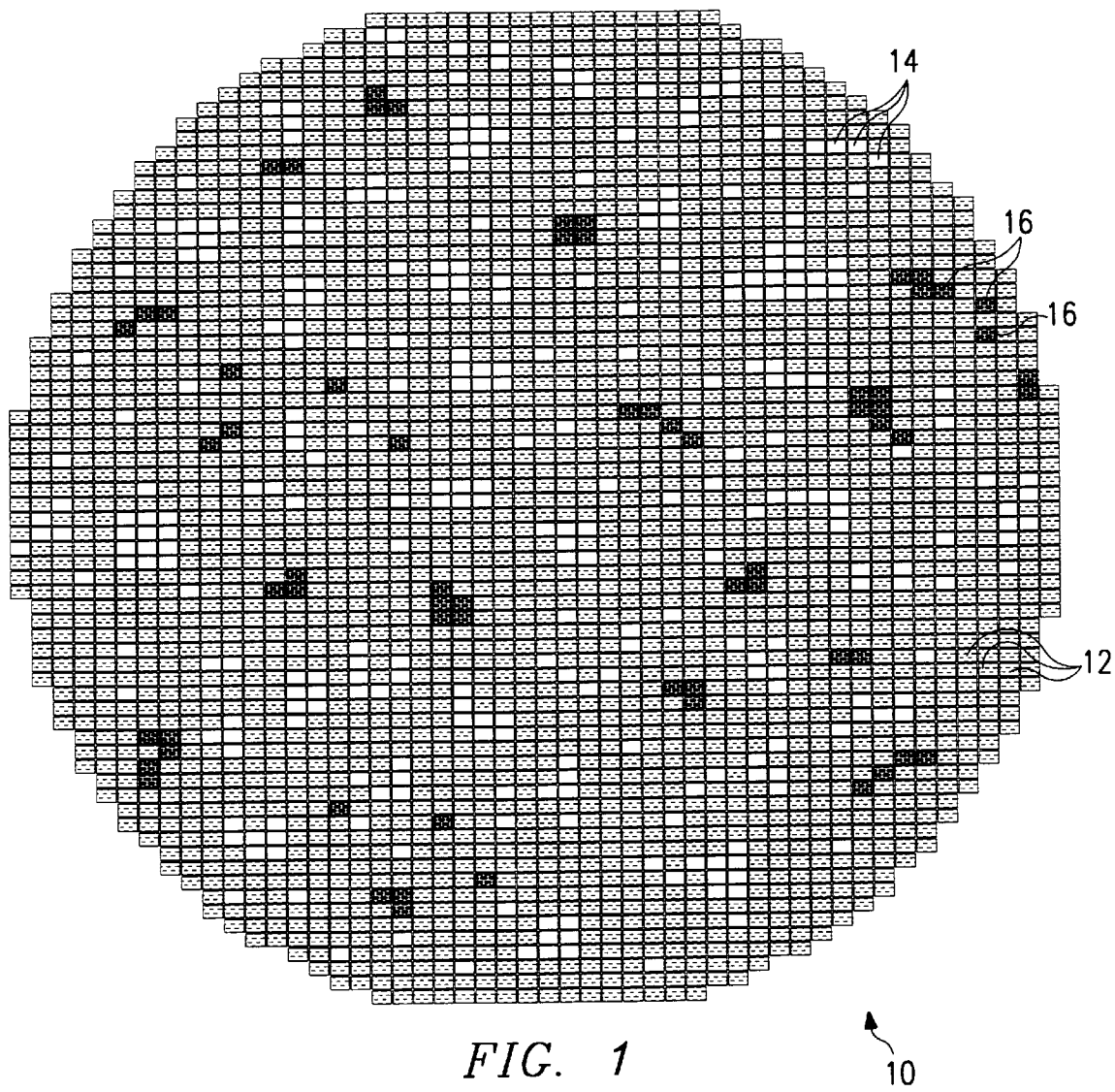
FIG. 1 is a map of a wafer test results showing chips that pass and chip first test failures and second test failures.

FIG. 1 is a wafer map 10 showing the chips 12 that passed initial testing (shown in gray), the chips 14 that passed retesting in accordance with the invention (shown in white), and the failed chips 16 (shown in black). Out of 2,219 chips tested on this wafer, 154 chips failed the first test. After retest, only 27 of the initially failed test chips remained as failed chips. Therefore the method of the invention saved a substantial number of the tested chips from being rejected.

Figure 2:
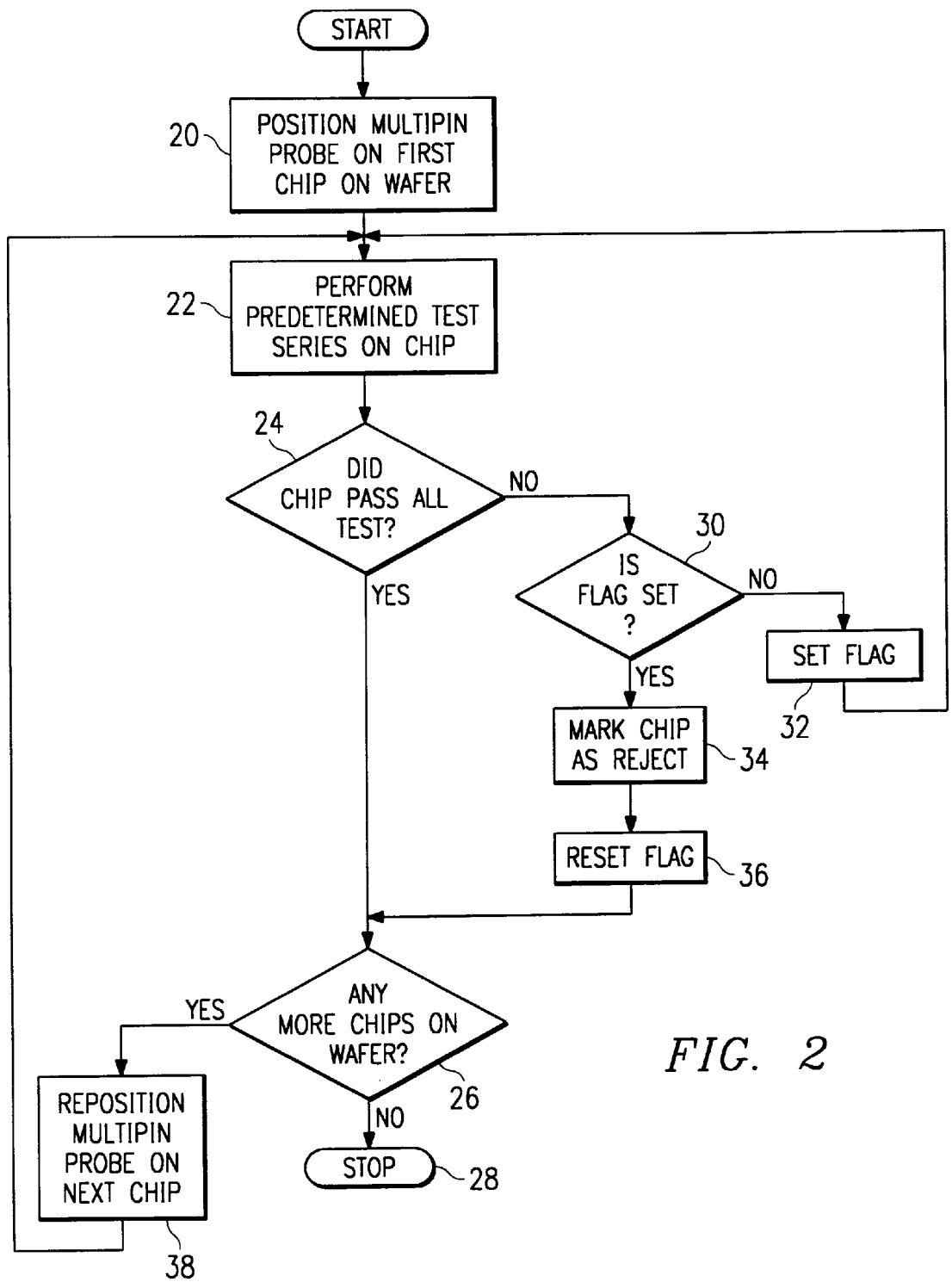
FIG. 2 is a flow diagram of the method in accordance with the present invention.

Implementation of this method is achieved by modifying the single Universal Support Package tester control software program common to all semiconductor circuit chip testers such as Texas Instrument's SFAB Impact tester. The method according to the invention is shown in block form in FIG. 2. Process flow begins in control block 20 with the program instructing the multi-pin probe to index to the first chip 12 on the wafer 10. Once the probe is in full contact with all of the pins on the chip 12, flow passes to step 22 and a predetermined series of tests as briefly described above are performed on each pin on the chip. These tests require a number of relay operations to connect various power supplies and test circuitry with the pin for each individual test. The number of different tests per pin may be between 100 and 200 separate tests, each requiring a different relay and test circuitry configuration. After the test series, program control transfers to block 24 where the query is made whether the chip under test passed all the tests. If yes, control passes to block 26 where the query is made whether there are any more chips to be tested on the wafer 10. If there are none, control passes to block 28 and the wafer is removed for further processing.

However, if, in block 24, the answer is no, control passes to block 32 where the query is made whether a failure flag has been set. The first time through this sequence, the flag will not be set. Therefore control passes to block 32 where the flag is set and the control transfers back to block 22 where the test sequence is again performed. If the chip fails again, control passes through block 24 to block 30, where the flag condition is again queried. This time, the flag has been set, and therefore control transfers to block 34 where the chip is marked as a failure. Control then transfers to block 36 where the failure flag is reset. Control then passes back to block 26. When there are additional chips to be tested as indicated in control block 26, program control transfers to block 38 where the multi-pin probe is indexed to the next chip to be tested. Control then passes back to block 22 and the above process repeated until there are no more chips to be tested on the wafer.

The method described above is an easily implemented testing procedure that increases yield and enhances tester and program problem recognition. Without the retest procedure and the recovery recognition in accordance with the present invention, the chip failures are easily mistaken as scattered failures on the wafer map during and after probing. Results of the procedure have shown a 0.2% recapture rate before the tester or program problem is corrected. This small percentage recovers hundreds of thousands of dollars a year, but it does not show the amount of yield loss that would have continued to occur without the retest recapture designation.

A less than 1% increase in test time is calculated when using the retest on standard programs. However, the effect of this increase may be minimized by reducing wait time. Wait times in the control program are over conservative in order to ensure that no yield loss would occur doe to testing process instabilities in the multi-probe. These wait times can be cut to a minimum reducing test times from 15 to 30%. This is possible because the scattered initial chip failures will be recaptured by the immediate retest incorporated in the overall control program in accordance with this invention. The overall result is a substantial cycle time reduction in the production process and improved product yield. Advantages attached to this retest procedure are enhanced problem recognition, reduced cycle time without yield loss, and higher yields on nominal wafers from recovery of low-level false fails.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A method for reducing rejects during in-situ testing of semiconductor circuit chips on a substrate wafer prior to separation of said chips comprising the steps of:

a) positioning a multiprobe in contact with leads of a first semiconductor circuit chip on a wafer;

b) performing a predetermined series of tests once on the first semiconductor circuit chip;

c) determining whether said first semiconductor circuit chip failed one of the tests in the series of tests; and d) performing the predetermined series of tests a second time on the first chip if said first circuit chip failed one of said tests;

e) flagging the chip as a reject only if the chip fails one of the tests performed for the second time; and f) repositioning the multiprobe to another chip on the wafer and repeating steps b) through e) until all chips on the wafer have been tested.

2. The method according to claim 1 wherein said series of tests includes a continuity test.

3. The method according to claim 1 wherein said step e) comprises flagging the chip as a reject only if the chip fails, in said series of tests performed for the second time, said one test failed in said first series of tests.

4. The method according to claim 3 wherein said series of tests includes a continuity test.

5. The method according to claim 1 wherein said chip is an integrated circuit.

6. The method according to claim 5 wherein said series of tests includes a continuity test.

7. The method according to claim 6 wherein said step e) comprises flagging the chip as a reject only if the chip fails, in said series of tests performed for the second time, said one test failed in said first series of tests.

8. The method according to claim 5 wherein each of said integrated circuit chips has at least 20 leads.

9. The method according to claim 8 wherein said series of tests includes a continuity test.

10. The method according to claim 9 wherein said step e) comprises flagging the chip as a reject only if the chip fails, in said series of tests performed for the second time, said one test failed in said first series of tests.

11. A method for reducing rejects during in-situ testing of multi-lead integrated circuit chips on a substrate wafer prior to separation of said chips from said wafer during the chip manufacturing process comprising the steps of:

a) positioning a multiprobe in contact with all of the leads of a first integrated circuit chip on a wafer;

b) performing a predetermined series of tests once on the first integrated circuit chip;

c) determining whether said first integrated circuit chip failed one of the tests in the series of tests; and d) if said first circuit chip failed one of said tests, performing at least the failed test a second time on the first chip;

e) flagging the chip as a reject only if the chip fails said at least one test performed for the second time; and f) repositioning the multiprobe to another chip on the wafer and repeating steps b) through e) until all chips on the wafer have been tested.

12. The method according to claim 11 wherein said series of tests includes a continuity test.

13. The method according to claim 11 wherein said step e) comprises flagging the chip as a reject only if the chip fails any of said series of tests performed for the second time.

14. The method according to claim 13 wherein said series of tests includes a continuity test.

15. The method according to claim 11 wherein said step e) comprises flagging the chip as a reject only if the chip fails, in said series of tests performed for the second time, said one test failed in said first series of tests.

16. The method according to claim 15 wherein each of said integrated circuit chips has at least 20 leads.

17. The method according to claim 16 wherein said series of tests includes a continuity test.

18. The method according to claim 11 further comprising the steps of:

g) separating said chips on said wafer; and h) separating said flagged chips into a bin separate from a bin containing bins that passed said series of tests.

19. A method for reducing rejects during in-situ testing of multi-lead integrated circuit chips on a substrate wafer prior to separation of said chips from said wafer during the chip manufacturing process comprising the steps of:

a) positioning a multiprobe in contact with all of the leads of a first integrated circuit chip on a wafer;

b) performing a predetermined series of tests once on the first integrated circuit chip;

c) determining whether said first integrated circuit chip failed one of the tests in the series of tests; and d) if said first circuit chip failed one of said tests, performing each of said tests a second time on the first chip;

e) flagging the chip as a reject only if the chip fails said failed test performed for the second time;

f) repositioning the multiprobe to another chip on the wafer and repeating steps b) through e) until all chips on the wafer have been tested; and g) discarding said rejected chips.

20. The method according to claim 19 wherein said step of discarding comprises the steps of separating said chips from said wafer and sorting said failed chips into a bin separate from said chips that passed said series of tests.

* * * * *